(12) United States Patent
Sasaki

(10) Patent No.: US 7,889,576 B2
(45) Date of Patent: Feb. 15, 2011

(54) SEMICONDUCTOR STORAGE DEVICE

(75) Inventor: Hirotoshi Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 135 days.

(21) Appl. No.: 12/411,626

(22) Filed: Mar. 26, 2009

(65) Prior Publication Data
US 2009/0244955 A1 Oct. 1, 2009

(30) Foreign Application Priority Data
Mar. 27, 2008 (JP) .............................. 2008-082673

(51) Int. Cl.
G11C 11/00 (2006.01)
G11C 8/08 (2006.01)
G11C 7/00 (2006.01)
(52) U.S. Cl. .......................... 365/189.16; 365/230.05; 365/154; 365/203; 365/230.06
(58) Field of Classification Search .................. None
See application file for complete search history.

(56) References Cited

U.S. PATENT DOCUMENTS 6,292,388 B1 * 9/2001 Camarota .................. 365/156
7,161,868 B2 * 1/2007 Morishima ............. 365/230.05
2002/0163824 A1 * 11/2002 Athanassiadis .............. 365/49

FOREIGN PATENT DOCUMENTS

JP 2005-025863 A 1/2005

* cited by examiner

Primary Examiner—Hoai V Ho
Assistant Examiner—James G Norman
(74) Attorney, Agent, or Firm—Fujitsu Patent Center

(57) ABSTRACT

This invention provides static random access memory (SRAM). The SRAM has a plurality of memory cells arranged in row and column directions. The plurality of memory cells each have a latch circuit in which input and output terminals of a pair of inverters are cross-connected and which maintains complementary levels at a pair of storage nodes, and a pair of write transistors provided between the pair of storage nodes and a prescribed power supply voltage. Further, the gate potentials of the pair of write transistors are respectively controlled according to a row address, a column address, and write data.

16 Claims, 12 Drawing Sheets

SEMICONDUCTOR STORAGE DEVICE

CROSS-REFERENCE TO RELATED APPLICATION

This application is based upon and claims the benefit of priority of the prior Japanese Patent Application No. 2008-82673, filed on Mar. 27, 2008, the entire contents of which are incorporated herein by reference.

FIELD

This invention relates to a semiconductor storage device, and in particular relates to static RAM (SRAM).

BACKGROUND

Static RAM is used as high-speed semiconductor memory in various equipment, and is incorporated into various system LSIs. SRAM does not lose stored data the way DRAM does, and SRAM does not require periodic refresh operations. But a memory cell of SRAM normally has a latch circuit comprising a pair of CMOS inverters with inputs and outputs cross-connected, and one pair of access transistors, for a total of six transistors. Hence in order to increase storage capacity, transistor miniaturization is necessary.

SRAM has a plurality of word lines which select memory cells in the row direction, and a plurality of bit line pairs which select memory cells in the column direction. By driving a word line, access transistors are made to conduct, and storage node pairs of the latch circuits in memory cells are connected to bit line pairs. Then, read operations and write operations can be performed via the bit line pairs.

In a write operation, from a state in which the bit line pair is precharged, one line of the selected bit line pair is discharged to generate a potential difference across the bit line pair, and then the word line is driven to cause the access transistors to be conducting, so that the bit line pair potential difference is used to write data to the memory cell. Hence a write operation entails an operation of pulling down a precharged bit line to L level, so that a large amount of power is consumed.

In a read operation, from a state in which the bit line pair is precharged, the word line is driven to cause the access transistors to be conducting, a bit line is driven to L level from one storage node of the memory cell latch circuit, and the potential difference generated across the bit line pair is detected. Hence in a read operation, the word line is driven to connect the bit line pair to the memory cell latch circuit via the access transistors, and so the memory cell operating margin must have at least a fixed value or higher in order that the memory cell latch circuit is not inverted due to the effects of external noise and similar.

In Japanese Patent Laid-open No. 2005-25863, two-port SRAM is disclosed. The SRAM disclosed has a pair of CMOS inverters, an access transistor pair which connects the pair of CMOS inverters to a bit line pair, a word line pair which controls conduction of the respective transistors of the access transistor pair, and a pair of read transistors which respectively read the output nodes of the pair of CMOS transistors; the lines of the word line pair control conduction of the respective transistors of the read transistor pair.

SUMMARY

In SRAM, during a write operation, after precharging the bit line pair one of the bit lines must be driven to L level, and the power consumption entailed by this driving is considerable. In order to reduce power consumption, lower power supplies, multiple power supply voltages, and similar have been proposed; but so long as bit line are charged and discharged, no greater reduction in power consumption can be expected.

In addition, in a read operation, the storage node pair of the latch circuit within the memory cell is connected to the bit line pair via the access transistor pair, so that the noise margin of the memory cell latch circuit must have at least a fixed value or higher. The need for a noise value at or above a fixed value for the memory cell is in a tradeoff relationship with the miniaturization of transistors that accompanies larger storage capacities. That is, as transistors are made smaller, variation in the transistor characteristics, such as threshold voltages, is increased, and the noise margin of the memory cell latch circuit is lowered.

Hence an object of this invention is to provide SRAM with reduced power consumption.

An another object of this invention is to provide SRAM in which the stability of memory cells in read operations is not diminished.

Static random access memory has a plurality of memory cells arranged in row and column directions. The plurality of memory cells each have a latch circuit, in which input and output terminals of a pair of inverters are cross-connected, and which maintains complementary levels at a pair of storage nodes, and a pair of write transistors, provided between the pair of storage nodes and a prescribed power supply voltage. Further, the gate potentials of the pair of write transistors are respectively controlled according to a row address, a column address, and write data.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Figure 1:
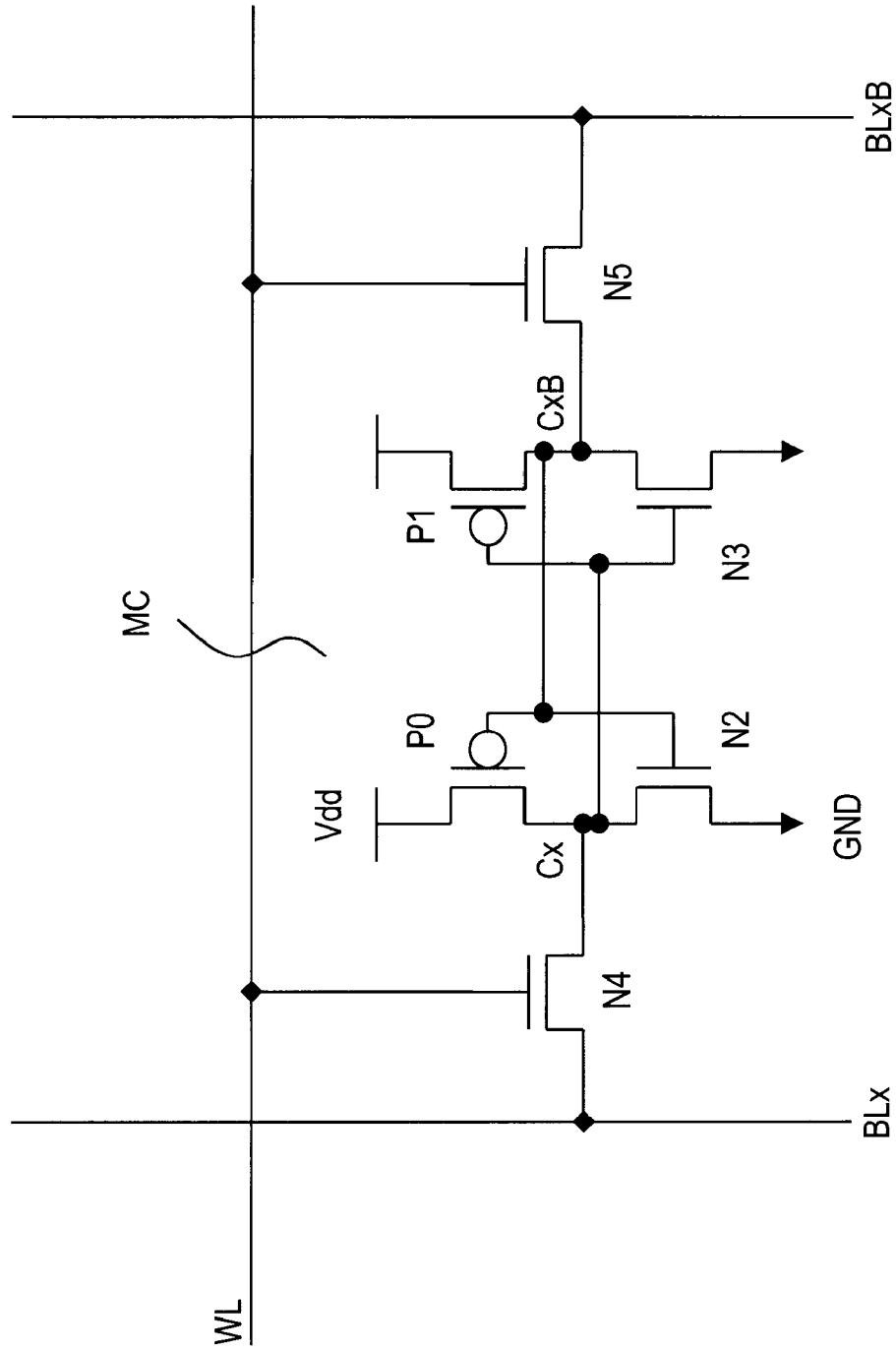
FIG. 1 is a diagram showing a memory cell of SRAM.

Below, embodiments of the invention are explained referring to the drawings. However, the technical scope of the invention is not limited to these embodiments, but extends to the inventions described in the Scope of Claims, and to inventions equivalent thereto.

FIG. 1 shows a memory cell of SRAM. A memory cell MC in SRAM has a latch circuit, in which a first CMOS inverter, comprising a P-channel transistor P0 and an N-channel transistor N2, and a second CMOS inverter, comprising a P-channel transistor P1 and an N-channel transistor N3, are configured with the input and output terminals thereof cross-connected. The latch circuit holds, on a pair of storage nodes Cx and CxB, H level and L level, or L level and H level, data (complementary data). And, the storage nodes Cx and CxB are connected to the pair of bit lines BL and BLB via the pair of access transistors N4 and N5 respectively. The gates of the N-channel access transistors N4 and N5 are connected to the word line WL, and when the word line WL is driven to H level, the access transistors N4 and N5 conduct, and the pair of storage nodes Cx and CxB within the memory cell are connected to the pair of bit lines BL and BLB.

In this specification, the symbol "P" is used for P-channel transistors, and the symbol "N" is used for N-channel transistors.

In a read operation, when the word line WL is driven, one line among the pair of bit lines BL and BLB precharged to H level, is driven to L level by the memory cell latch circuit. Then, the level of the bit line is detected by a sense amplifier, not shown, and is output as read data. The bit lines are directly connected to the storage nodes Cx, CxB of the memory cell latch circuit, so that there are cases in which the state of the memory cell latch circuit is inverted due to noise caused by the bit line potential.

On the other hand, in a write operation, one line among the pair of bit lines BL, BLB precharged to H level is driven to L level by a write amplifier, not shown, and the word line WL is driven. In response, the latch state of the memory cell latch circuit is driven and inverted. That is, in the write operation, the long bit line pair BL, BLB must be charged and discharged, and the power consumption of the write operation is large compared with that of the read operation.

Figure 2:
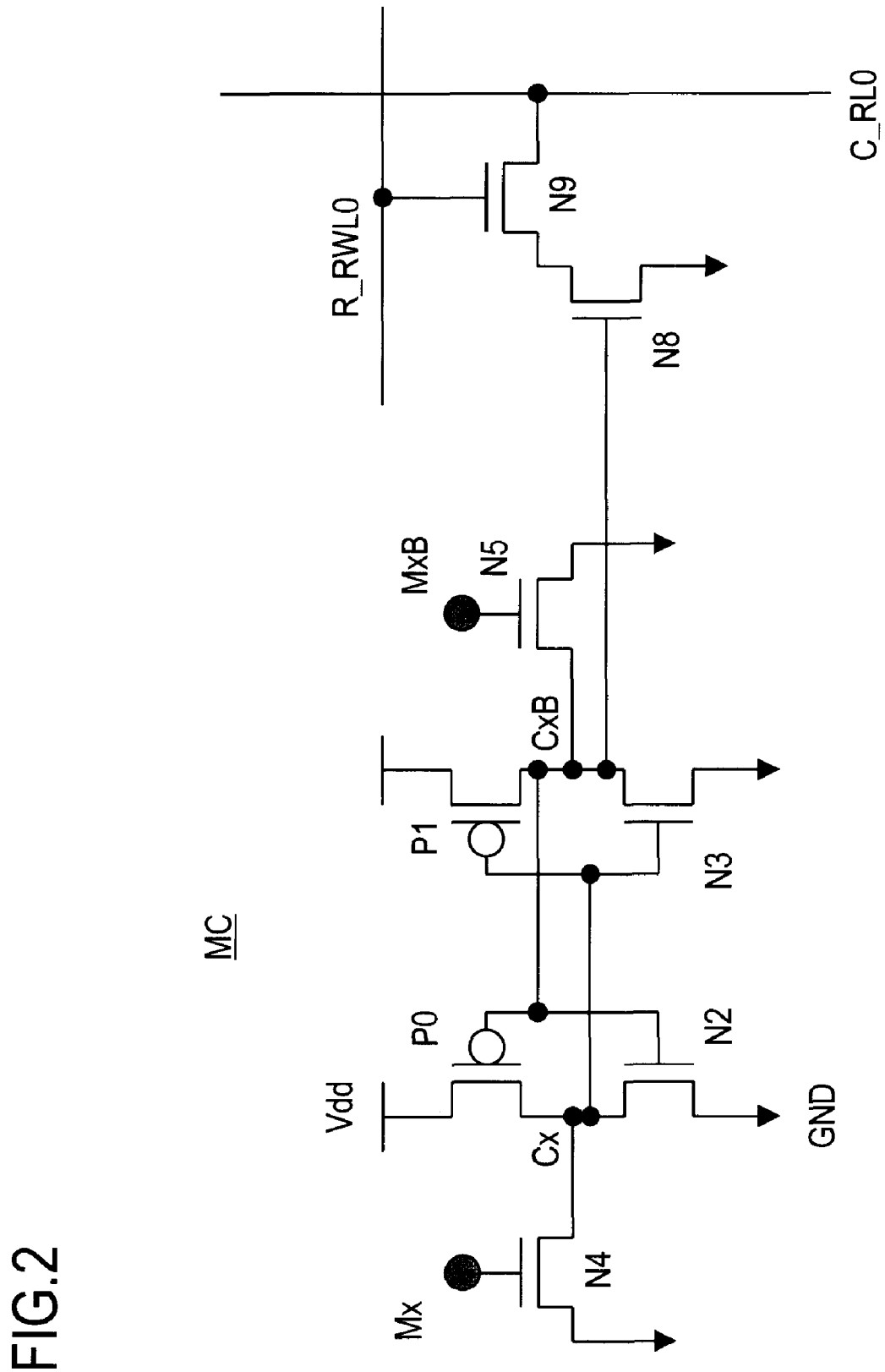
FIG. 2 is a circuit diagram of a memory cell in static random access memory of this embodiment.

FIG. 2 is a circuit diagram of a memory cell in static random access memory of an embodiment of the invention. The memory cell MC has a latch circuit (P0, P1, N2, N3), in which the input and output terminals of a CMOS inverter comprising transistors P0 and N2 and a CMOS inverter comprising transistors P1 and N3 are cross-connected, and complementary levels corresponding to the write data are maintained at the pair of storage nodes Cx, CxB, and a pair of write transistors N4, N5, provided between the pair of storage nodes Cx and CxB and a prescribed power supply voltage, such as for example ground GND. The potentials at the gates Mx, MxB of the pair of write transistors N4, N5 are respectively held at H level or at L level according to the row address, the column address, and the write data.

The memory cell MC has a read transistor N8, having a gate which is controlled at the potential of one of the pair of storage nodes Cx and CxB, for example CxB, and which drives the read line C_RL0. The read transistor N8 is connected to the read line C_RL0 via the read select transistor N9, which is controlled to be conducting by the read word line R_BWL0. The storage node CxB may be connected to the gate of the read transistor N8 via the read select transistor N9. The configuration is as shown in FIG. 12.

That is, in memory cell MC illustrated in FIG. 2, a read port circuit, comprising a read transistor N8 and a read select transistor N9, is provided at the storage node CxB. At the storage node Cx on the opposite side also, a read port circuit comprising a read transistor N8 and a read select transistor N9 may be provided. This read port circuit drives another read line C_RL, not shown.

The memory cell MC of this embodiment may have a read port circuit provided only on one side, or may have read port circuits provided on both sides.

Figure 12:
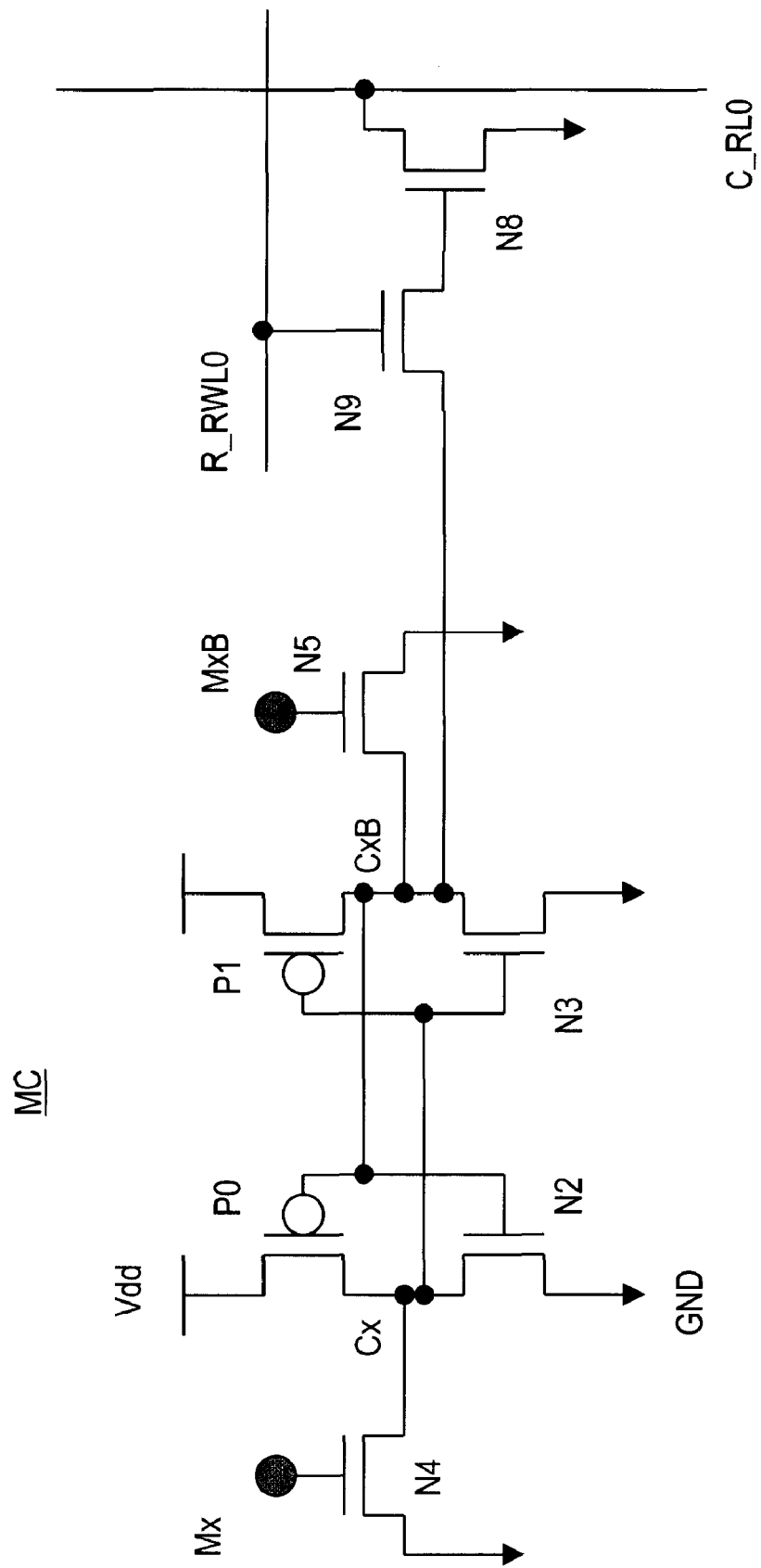
FIG. 12 is a circuit diagram of a memory cell in static random access memory according to the present embodiment.

Further, as shown in FIG. 12, a read select transistor N9 may be provided between the gate of the read transistor N8 and the storage node CXB.

In the memory cell MC of FIG. 2, the latch circuit having transistors P0, P1, N2, N3 is provided with a write circuit having write transistors N4, N5, and a read circuit having a read transistor N8. The write circuit and the read circuit operate independently.

In a write operation, one of the pair of nodes Mx and MxB is driven to H level according to the row and column addresses and the write data. In response, one of the write transistors N4, N5 becomes conducting, and the conducted write transistor pulls one of the storage nodes Cx and CxB to ground potential, so that the latch state of the latch circuit is inverted. That is, the operation to write to the latch circuit is one-sided writing.

In the memory cell MC of FIG. 2, unlike the memory cell of FIG. 1, the storage nodes Cx, CxB of the memory cell are not connected to the bit line pair via the access transistors, and the latch circuit is not inverted by the potentials of the bit line pair. The storage nodes Cx, CxB of the memory cell MC are driven to L level by the transistors N4 and N5, and by this means the latch circuit is inverted. Hence a configuration enabling accommodation of a bit line pair is not necessary, and in a write operation, there is no need to charge and discharge the bit line pair, so that power consumption can be greatly reduced.

Further, in a read operation, the read transistor N8 is controlled by one of the storage nodes Cx and CxB, and drives the read line C_RL0. Read operations are also one-sided read operations. Hence in this memory cell MC, the latch circuit within the memory cell MC does not directly drive the bit lines, and the latch circuit is not directly connected to the bit lines and read line outside the memory cell. Consequently direct application of noise to the latch circuit from bit line is suppressed, and reduction of the latch circuit operating margin can be allowed. The read word line R_RWL0 extends in the row direction, and the read line C_RL0 extends in the column direction. However, the row direction and column direction may be reversed.

The gate electrodes Mx, MxB of the write transistors N4, N5 are driven to H level, based on the logical product of the column write word line pair driven based on the column address and write data, and the row write word line driven based on the row address. Or, the gate terminals Mx, MxB of the write transistors N4, N5 are driven to H level based on the logical product of the row write word line pair driven based on the row address and write data, and the column write word line driven based on the column address. The former is the first embodiment, and the latter is the second embodiment.

First Embodiment

Figure 3:
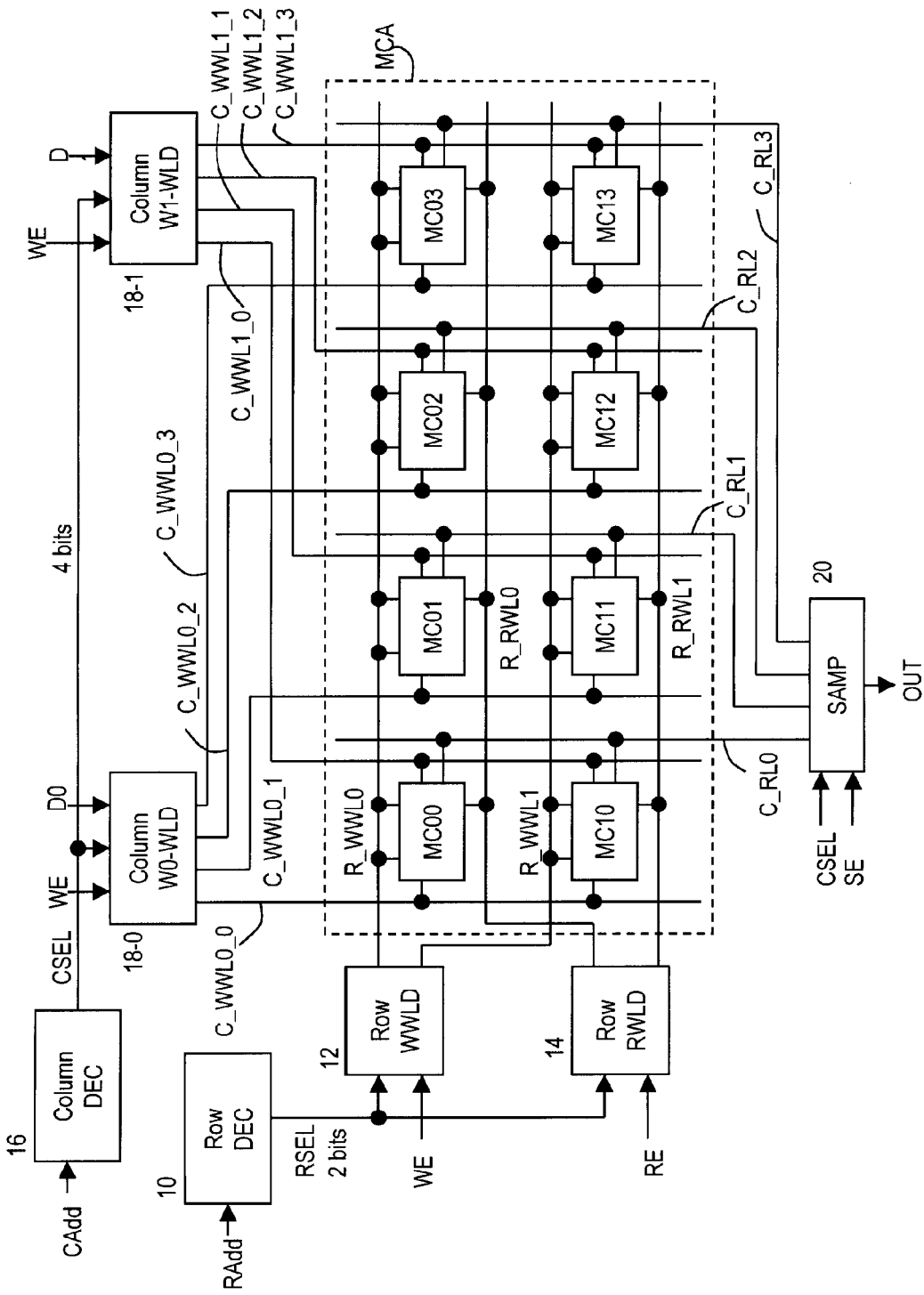
FIG. 3 a diagram showing the configuration of static random access memory of the first embodiment.
Figure 4:
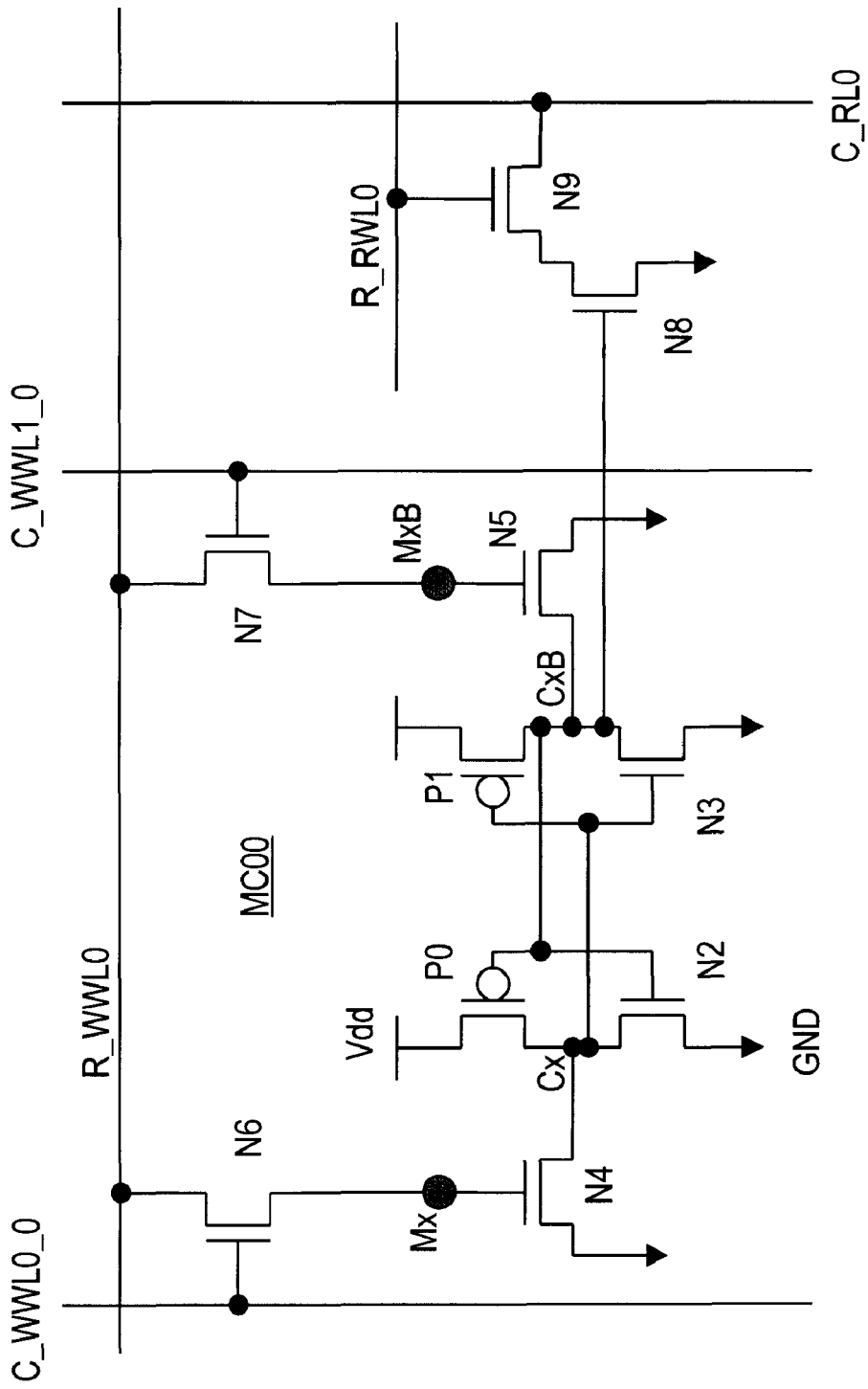
FIG. 4 is a circuit diagram of a memory cell in the first embodiment.

FIG. 3 shows the configuration of static random access memory of the first embodiment. FIG. 4 is a circuit diagram of a memory cell in the first embodiment.

In the SRAM of FIG. 3, the memory cell array MCA has a plurality of memory cells MC00 to MC13, arranged in a matrix in the row direction and column direction. As one example, memory cells are shown having two rows and four columns. Each memory cell MC is connected to a first write word line extending in the row direction, that is, the row write word lines R_WWL0, 1, and to a plurality of second write word lines extending in the column direction, that is, the column write word line pairs C_WWL0_0 to 3, C_WWL1_0 to 3. Further, each memory cell MC is connected to a read word line extending in the row direction, that is, the row read word lines R_RWL0, 1, and to a read line extending in the column direction, that is, the column read lines C_RL0 to 3.

As shown in the memory cell circuit diagram of FIG. 4, a memory cell MC00 has, in addition to the transistors P0, P1, N2 to N5, N8, and N9 shown in FIG. 2, a pair of write select transistors N6 and N7. The gate of the write select transistor N6 is connected to the column write word line C_WWL0_0, and the gate of the other write select transistor N7 is connected to the column write word line C_WWL1_0. The drains of these transistors N6 and N7 are connected to the row write word lines R_WWL0, and the sources are connected to the gates Mx and MxB of the write transistors N4 and N5, respectively.

In a write operation, one of the write select transistors N6 and N7 is controlled to be conducting by the column write word line pair C_WWL0_0 and C_WWL1_0. And, one of the gates Mx and MxB is driven to H level, according to the H level of the row write word driver R_WWL0. In response, one of the write transistors N4, N5 becomes conducting, and one of the storage nodes Cx, CxB of the latch circuit is pulled down to ground potential. By this means, the latch state of the latch circuit is inverted, and writing is performed.

In a read operation, in response to the H level on the row read word line R_RWL0, the read select transistor N9 conducts, and the gate of the read transistor N8 is driven by the other storage node CxB to cause the drain to be connected to the column read line C_RL0. And, the read transistor N8 drives or does not drive the column read line C_RL0 to L level according to the potential at the storage node CxB. When the storage node CxB is at L level, the read transistor N8 conducts, and the column read line C_RL0 is driven to ground level. Conversely, when the storage node CxB is at H level, the read transistor N8 does not conduct, and the column read line C_RL0 is maintained at the precharge level (H level).

Returning to FIG. 3, the row decoder 10 decodes the row address RAdd and outputs a row selection signal RSEL. In this example, the row selection signal RSEL is a two-bit signal. The column decoder 16 decodes the column address CAdd, and outputs a column selection signal CSEL. In this example, the column selection signal CSEL is a four-bit signal.

The first write word line driving circuit, that is, the row write word line driver 12, is activated by a write enable signal WE, and drives one of the row word lines R_WWL0, 1 to H level, according to the row selection signal RSEL.

A second write word line driving circuit, that is, the column write word line driver 18-0, is activated by the write enable signal WE, and in response to the column selection signal CSEL and write data D0, drives to H level one of the column write word lines C_WWL0_0 to 3 on the left sides of the memory cells. Similarly, the other second write word line driving circuit, that is, the column write word line driver 18-1, is activated by the write enable signal WE, and drives to H level one of the column write word lines C_WWL1_0 to 3 on the right sides of the memory cells according to the column selection signal CSEL and write data D1. That is, among the columns of the pair of column write word lines selected by the column selection signal CSEL, only one of the word lines is driven to H level, according to the complementary write data D0, D1.

The read word line driving circuit, that is, the row read word line driver 14, is activated by a read enable signal RE, and based on the row selection signal RSEL, drives to H level one of the row read word lines R_RWL0, 1 below the memory cells.

Then, the sense amplifier unit 20 selects one of the column read lines C_RL0 to 3 according to the column selection signal CSEL, and in response to a sense enable signal SE, detects the read-out signal level, and outputs read data OUT.

Figure 5:
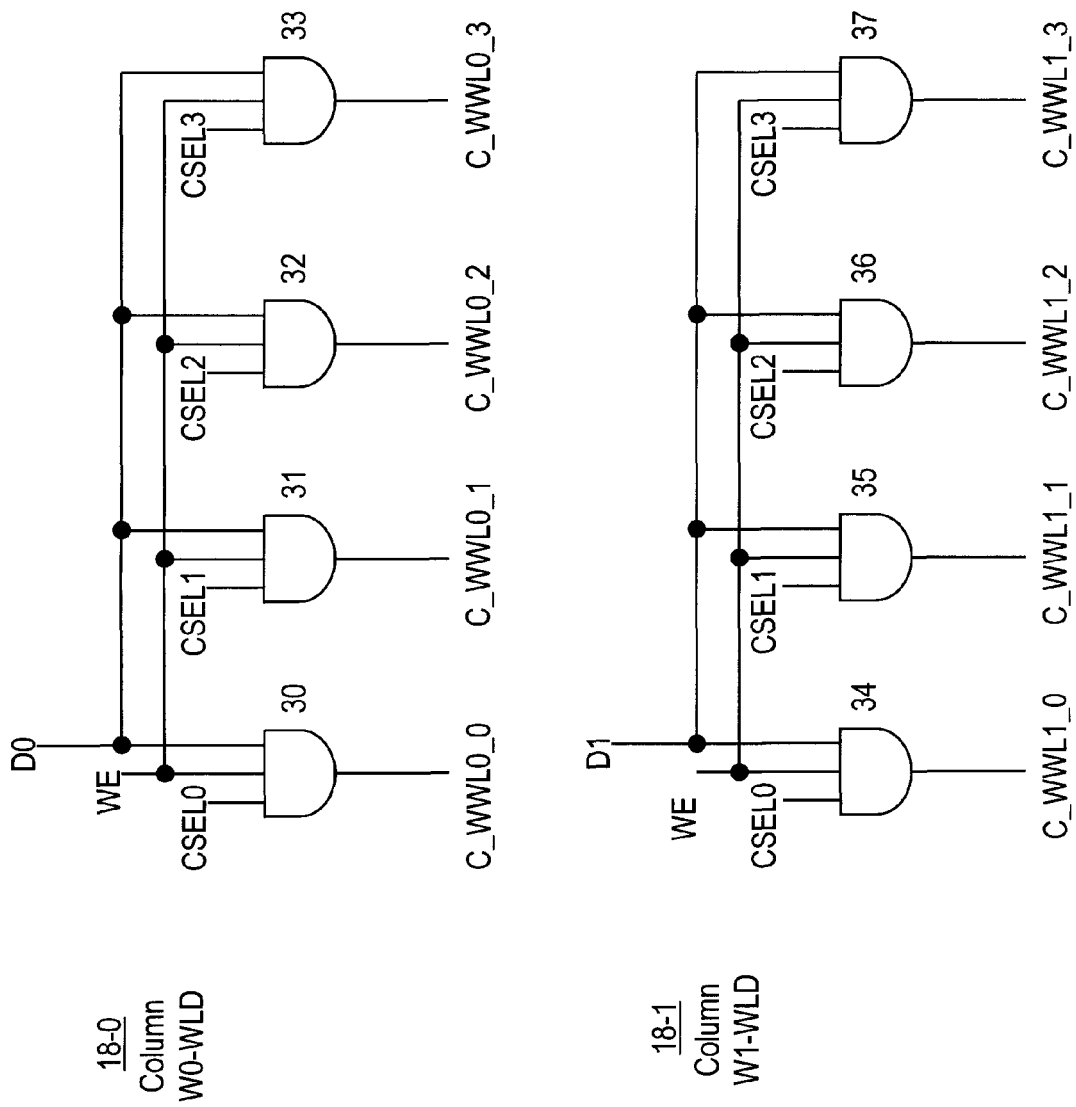
FIG. 5 is a circuit diagram of second write word line driving circuits.

FIG. 5 is a circuit diagram of second write word line driving circuits. The second write word line driving circuits, that is, column write word line drivers 18-0 and 18-1, are shown. The column write word line driver 18-0 drives the column write word lines C_WWL0_0 to 3 on the left sides of the memory cells MC. The column write word line driver 18-0 has for example four AND gates 30 to 33, and takes as inputs the write enable signal WE, write data D0, and column selection signals CSEL0 to 3. When the write enable signal WE is at H level, each AND gate drives a column write word line C_WWL0_0 to 3 according to whether the write data D0 is H level or L level based on the column selection signals CSEL0 to 3.

Similarly, the column write word line driver 18-1 drives the column write word lines C_WWL1_0 to 3 on the right sides of the memory cells MC. The column write word line driver 18-1 has for example four AND gates 34 to 37, and takes as inputs the write enable signal WE, write data D1, and column selection signals CSEL0 to 3. When the write enable signal WE is at H level, each AND gate drives a column write word line C_WWL1_0 to 3 according to whether the write data D1 is H level or L level based on the column selection signals CSEL0 to 3. The write data D0 and D1 have opposite levels, and are generated by an input circuit, not shown, based on input write data.

For example, when the write enable signal WE=H, the column selection signal CSEL0=H, and the write data is D0=H and D1=L, the AND gate 30 drives the column write word line C_WWL0_0 to H level. The other AND gates 31 to 37 drive the corresponding column write word lines to L level. With this, in the memory cell MC00 of FIG. 3, the write selection transistor N6 is conducting, and N7 is non-conducting.

Figure 6:
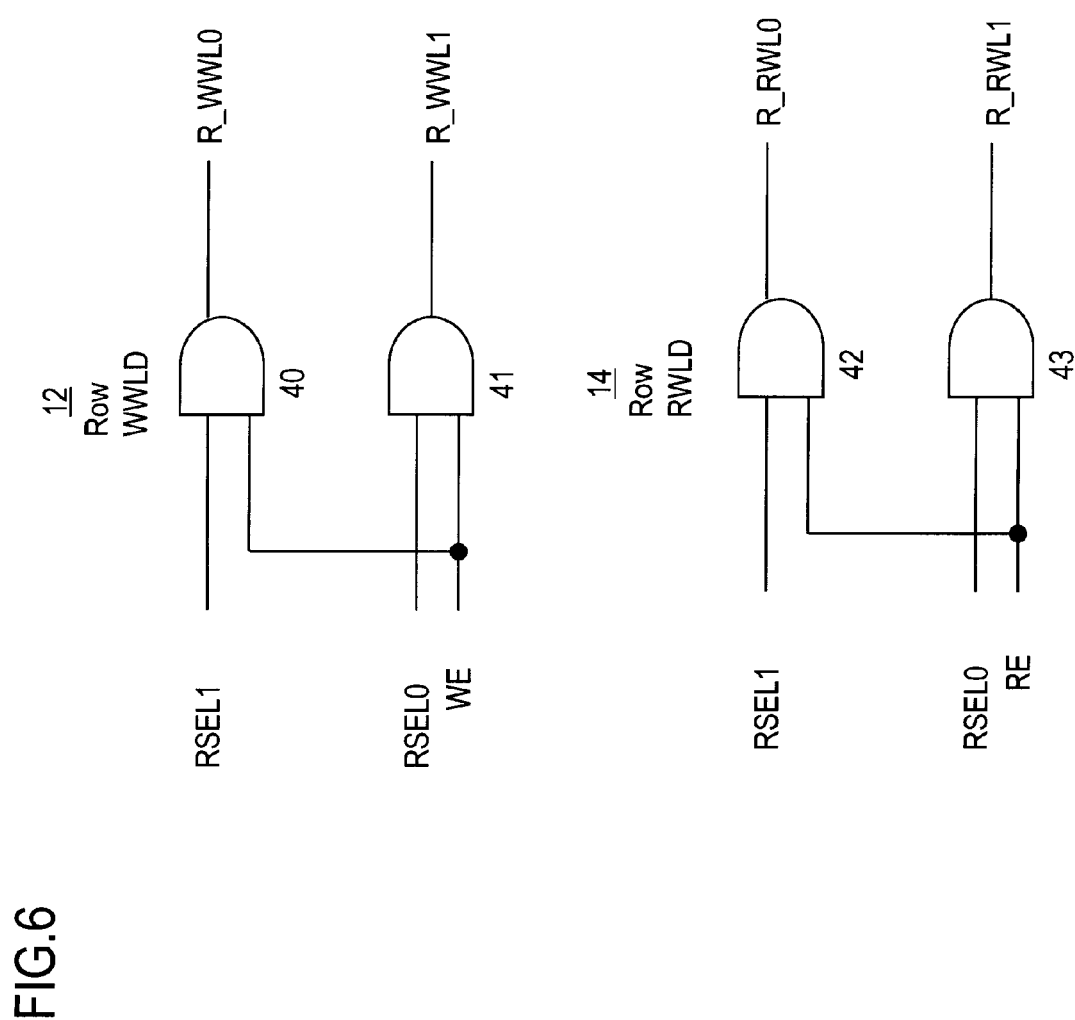
FIG. 6 is a circuit diagram of the first write word line driving circuit and the read word line driving circuit.

FIG. 6 is a circuit diagram of the first write word line driving circuit and the read word line driving circuit. The first write word line driving circuit, that is, the row write word line driver 12, has two AND gates 40 and 41, and, when the write enable signal WE=H, drives one of the row write word lines R_WWL0, 1 to H level, according to the row selection signals RSEL0, 1.

For example, when the write enable signal WE=H and the row selection signal RSEL0=H, the AND gate 40 drives the row write word line R_WWL0 to H level. Together with this, in the memory cell MC00 of FIG. 3, the H level on the row write word line R_WWL0 is transmitted via the conducting write selection transistor N6 or N7 to the gate Mx or MxB of the write transistor N4 or N5. In response, the write transistor N4 or N5, the gate of which has been driven to H level, conducts, one of the storage nodes Cx and CXB of the latch circuit is driven to L level, and the state of the latch circuit is inverted (or, if the write data is the same, the latch state is maintained).

In the above write operation, the column write word line C_WWL0_0 only drives the gate of the write selection transistor N6, the row write word line R_WWL0 only drives the gate of the write transistor N4, and so the required power consumption is small. Inversion of the latch circuit is performed by the write transistors N4, N5 within each memory cell. Hence compared with the case of the example illustrated in FIG. 1 in which the bit lines invert the latch circuits in the memory cells, the power consumption entailed by writing is small.

The read word line driving circuit of FIG. 6, that is, the row read word line driver 14, has two AND gates 42 and 43, and when the read enable signal RE=H, drives one of the row read word lines R_RWL0, 1 to H level according to the row selection signals RSEL0, 1.

For example, when the read enable signal RE=H and the row selection signal RSEL1=H, the AND gate 42 drives the row read word line R_RWL0 to H level. Together with this, in the memory cell MC00 of FIG. 3, the H level of the row read word line C_RWL0 causes the read selection transistor N9 to be conducting. And, the read transistor N8 becomes conducting or non-conducting according to the potential of the storage node CXB, to either drive the column read line C_RL0 to L level or to maintain the precharge level (H level).

In this way, in a read operation the storage nodes in the latch circuit of a memory cell MC are not directly connected to a bit line or column read line, so that inversion of the stored state due to noise during reading is suppressed. Hence the static noise margin of the memory cell latch circuit can be reduced.

Figure 7:
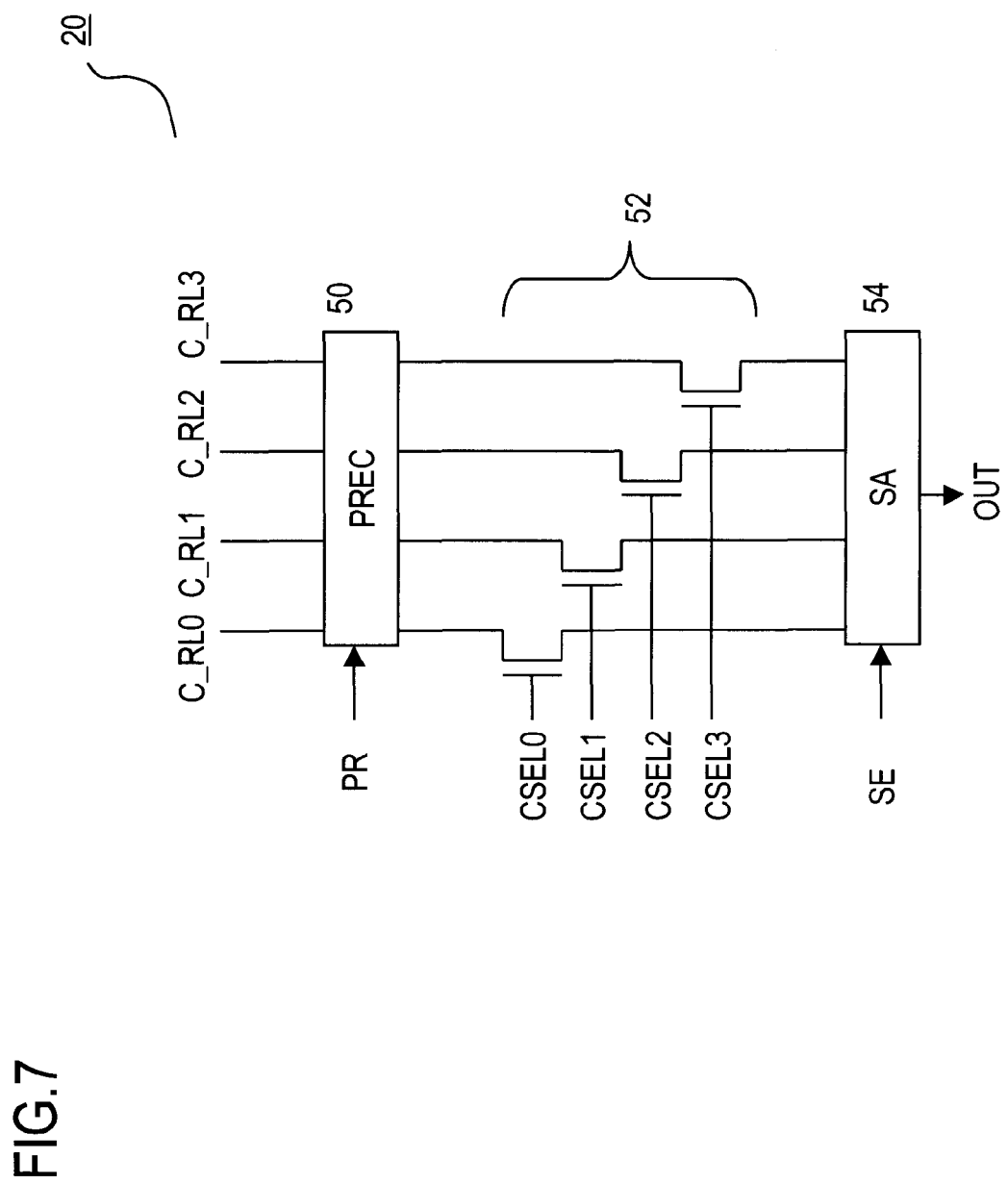
FIG. 7 is a circuit diagram of a sense amplifier unit 20.

FIG. 7 is a circuit diagram of a sense amplifier unit 20. In FIG. 7, a precharge circuit 50 which precharges the column read lines C_RL0 to 3 to H level in response to a precharge control signal PR is provided on the column read lines C_RL0 to 3. The column selection circuit 52 has selection transistors which conduct according to the column selection signals CSEL0 to 3, and connects only the selected column line among the column read lines C_RL0 to 3 to the sense amplifier circuit 54. The sense amplifier circuit 54 detects and amplifies the potential of the selected column read line in response to the sense enable signal SE, and outputs the read-out signal OUT.

Figure 8:
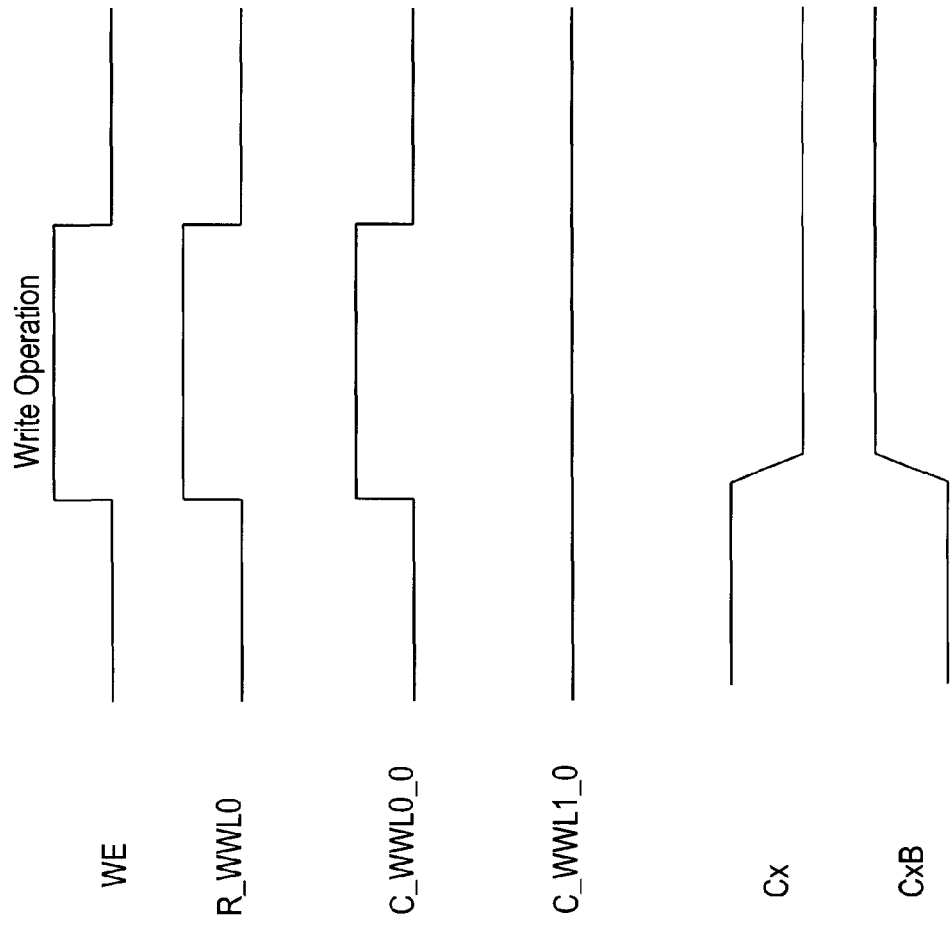
FIG. 8 is a timing chart showing an SRAM write operation in this embodiment.

FIG. 8 is a timing chart showing an SRAM write operation in this embodiment. In this example, write data D0=H, D1=L is written to the memory cell MC00 in FIG. 3. In the state in which the row selection signal RSEL0=H, when the write enable signal WE goes to H level, the first write word line driving circuit, that is, the row write word line driver 12, drives the row write word line R_WWL0 to H level in response. And, in the state in which the column selection signal CSEL0=H and the write data is D0=H and D1=L, when the write enable signal WE goes to H level, in response the second write word line driving circuit, that is, the column write word line driver 18-0, drives the column write word line C_WWL0 to H level, and the column word line driver 18-1 keeps the column write word line C_WWL1_0 at L level.

By this means, in the memory cell MC00 of FIG. 4, the write selection transistor N6 is conducting and the gate Mx of the write transistor N4 is driven to H level, so that the write transistor N4 drives the storage node Cx to ground level. As a result, the storage node Cx goes to L level, and the opposite-side storage node CxB goes to H level.

Figure 9:
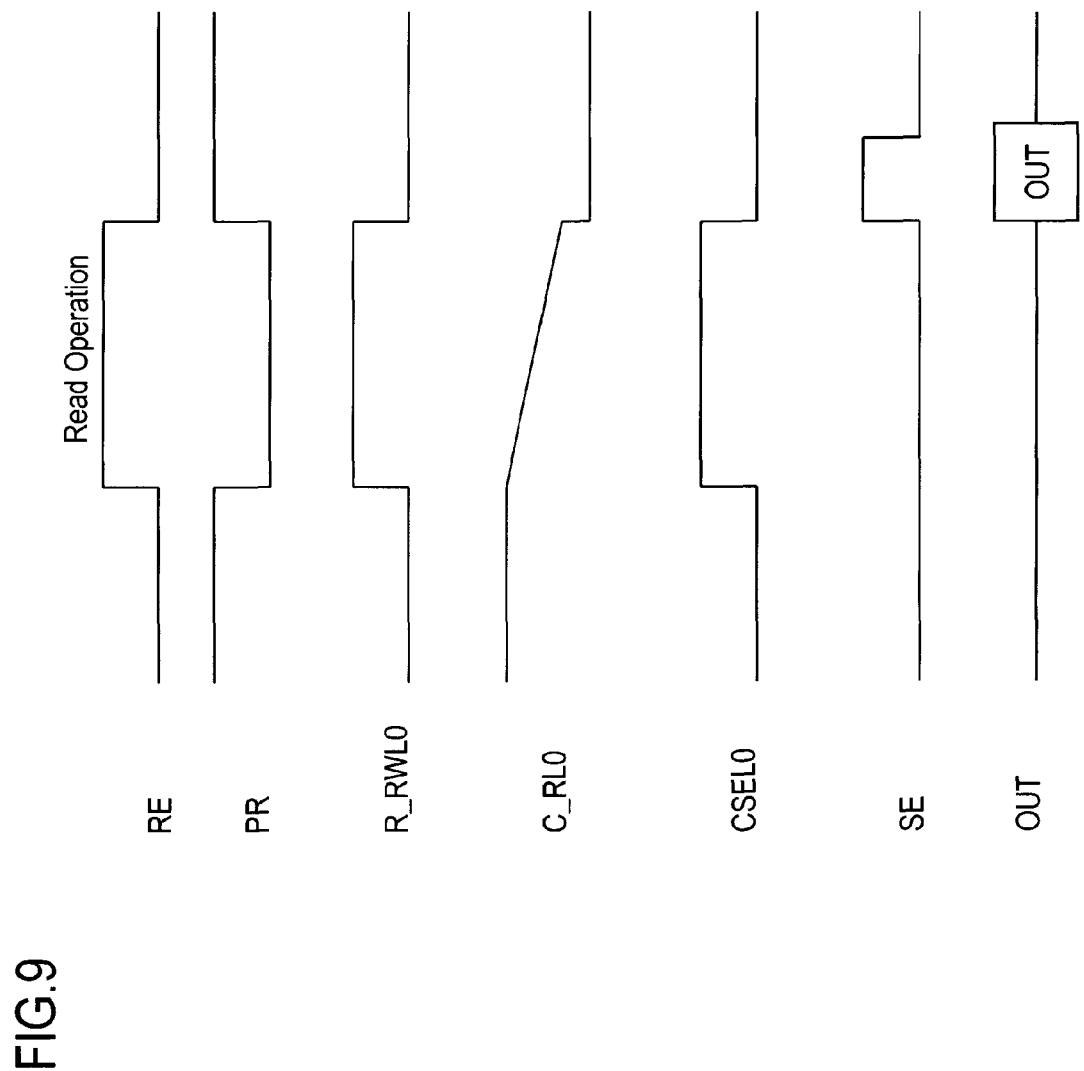
FIG. 9 is a timing chart showing an SRAM read operation in this embodiment.

FIG. 9 is a timing chart showing an SRAM read operation in this embodiment. In this example, data stored in the memory cell MC00 is read. When the read enable signal RE is at L level in the non-reading state, the precharge signal PR is set to H to cause the precharge circuit 50 to precharge all the column read lines C_RL0 to 3 to H level.

Then, in the state in which the row selection signal CSEL0=H, when the read enable signal RE goes to H level, in response the precharge signal PR goes to L and the precharge circuit 50 is made inactive. Together with this, the column selection signal CSEL0 goes to H level, and the column selection circuit 52 connects the column read line C_RL0 to the sense amplifier 54.

Further, the read word line driving circuit 14 drives the row read word line R_RWL0 to H level. In response, in the memory cell MC00 of FIG. 4, the read selection transistor N9 becomes conducting, and the drain terminal of the read transistor N8 is connected to the column read line C_RL0. If the storage node CxB is set to H level, the read transistor N8 becomes conducting, and the column read line C_RL0 is driven to ground level (L level). Together with this, the potential at the column read line C_RL0 gradually declines.

And, when the read enable signal RE goes to L level, the row read word line R_RWL0 falls to L level, and the read selection transistor N9 becomes non-conducting. Also, the column selection signal CSEL0 goes to L level, and the column read line C_RL0 becomes disconnected from the sense amplifier circuit 54. Then, in response to the sense enable signal SE=H, the sense amplifier circuit 54 is activated, the L level of the column read line C_RL0 is detected, and the read data OUT is output.

Second Embodiment

Figure 10:
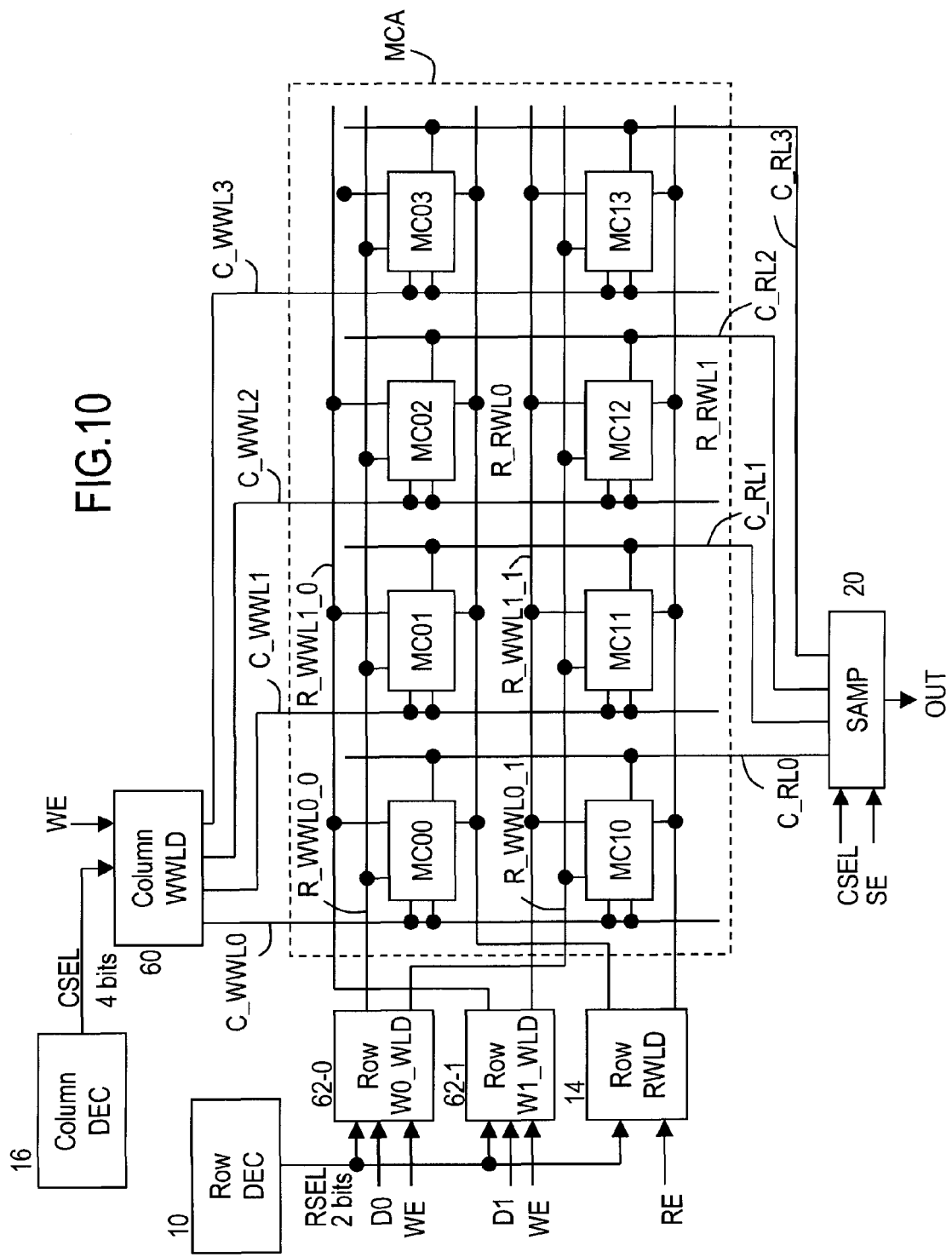
FIG. 10 a diagram showing the configuration of static random access memory in a second embodiment.
Figure 11:
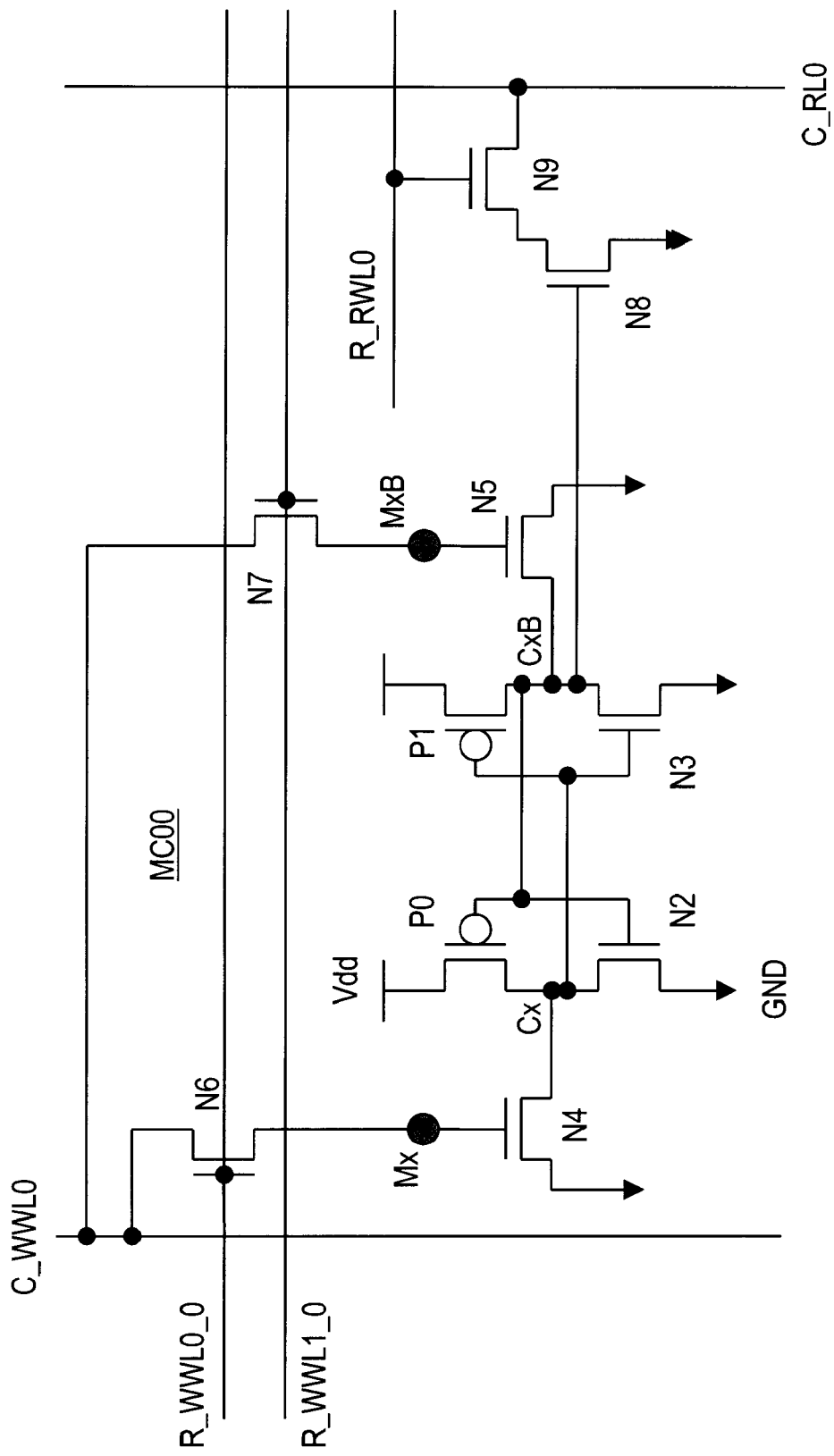
FIG. 11 is a circuit diagram of a memory cell in the second embodiment.

FIG. 10 shows the configuration of static random access memory in a second embodiment. FIG. 11 is a circuit diagram of a memory cell in the second embodiment. In the second embodiment, in contrast with the first embodiment in FIG. 3, first write word lines are column write word lines C_WWL0 to 3, arranged extending in the column direction, and second write word line pairs are row write word lines R_WWL0_0 to 1 and R_WWL1_0 to 1, arranged extending in the row direction. On the other hand, on the read side, similarly to the first embodiment, row read word lines R_RWL0, 1 which are read word lines are arranged extending in the row direction, and column read lines C_RL0 to 3 which are read lines are arranged extending in the column direction.

The first write word line driving circuit, that is, the column write word line driver 60, corresponds to the row word line driver 12 of FIG. 3, and is activated in response to a write enable signal WE=H, and drives to H level one of the column write word lines C_WWL0 to 3 according to column selection signals CSEL0 to 3.

The second write word line driving circuit, that is, the row write word line driver 62-0, corresponds to the column word line driver 18-0 of FIG. 3, is activated in response to a write enable signal WE=H, and drives one of the row write word lines R_WWL0_0 to 1 to the level of the write data D0 according to the row selection signals RSEL0, 1. The row write word line driver 62-1 corresponds to the column word line driver 18-1 in FIG. 3, is activated in response to a write enable signal WE=H, and drives one of the row write word lines R_WWL1_0 to 1 to the level of the write data D1 according to the row selection signals RSEL0, 1.

The row read word line driver 14 and sense amplifier unit 20 are the same as in FIG. 3. The row read word lines and column read lines may respectively be arranged in the column direction and in the row direction.

As shown in the circuit diagram for a memory cell MC00 in FIG. 11, the drains of the write selection transistors N6 and N7 are connected to the column write word line C_WWL0, and the gates are connected to the row write word liens R_WWL0_0 and R_WWL1_0, respectively. One of the write selection transistors N6 and N7 becomes conducting according to the row write word line R_WWL0_0 or R_WWL1_0 selected based on the write data and row address, and the level of the column write word line C_WWL0 selected based on the column address is applied to the gates Mx, MxB of the write transistors N4, N5. One of the write transistors N4, N5 becomes conducting according to the potentials on the gates Mx and MxB, and one of the storage node pair Cx, CxB is driven to L level.

The relation between the read-side circuit N8, N9, the row read word line R_RWL0, and the column read line C_RL0, is the same as in FIG. 3.

The second embodiment is the same as the first embodiment, except that the write-side first write word lines and second write word line pairs are arranged in the column direction and in the row direction respectively. Hence write operations are the same as in the first embodiment. The read-side circuit is the same as in the first embodiment, and the operation is also the same.

As shown in FIG. 3, in the first embodiment three lines are arranged in the column direction, which are the column write word line pair and the column read line, and two lines are arranged in the row direction, which are the row write word line and the row read word line. Hence this configuration is advantageous when the memory cell array MCA has a layout which is longer in the row direction than in the column direction. This is because the number of lines requiring high driving capability is greater in the column direction.

On the other hand, in the second embodiment, as shown in FIG. 10, two lines are arranged in the column direction, which are the column write word line pair, while three lines are arranged in the row direction, which are the row write word line pair and the row read word line. Hence this configuration is advantageous when the memory cell array MCA has a layout which is longer in the column direction than in the row direction.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A static random access memory, comprising:
    a plurality of memory cells arranged in row and column directions,
    wherein the plurality of memory cells each have:
    a latch circuit, in which input and output terminals of a pair of inverters are cross-connected, and which maintains complementary levels at a pair of storage nodes; and
    a pair of write transistors, provided between the pair of storage nodes and a prescribed power supply voltage;
    and wherein the gate potentials of the pair of write transistors are respectively controlled according to a row address, a column address, and write data.

2. The static random access memory according to claim 1, further comprising:
    a plurality of first write word lines extending in a first direction among the row and column directions; and
    a plurality of second write word line pairs extending in a second direction among the row and column directions,
    wherein the gate potentials of the pair of write transistors are controlled according to the potentials of the first write word line and the second write word line pair.

3. The static random access memory according to claim 2, wherein the plurality of memory cells each have a pair of write selection transistors which are provided between the first write word line and the gates of the pair of write transistors, and the gates of which are controlled by the second write word line pair, and
    wherein the plurality of first write word lines are selected based on one of the row address and the column address, and the plurality of second write word line pairs are selected based on the write data and on the other of the row address and the column address.

4. The static random access memory according to claim 3, further comprising:
    a first decoder, which decodes one of the row address and the column address;
    a second decoder, which decodes the other of the row address and the column address;
    a first write word line driving circuit, which drives any one of the plurality of first write word lines, according to a plurality of first selection signals output by the first decoder; and
    a second write word line driving circuit, which drives any one of the second write word line pairs, according to a plurality of second selection signals output by the second decoder and the write data.

5. The static random access memory according to claim 4, wherein the first and second write word line driving circuits perform driving operations in response to a write enable signal.

6. The static random access memory according to claim 2, further comprising:
    a plurality of read word lines extending in the first or second direction, and
    a read line intersecting the read word lines and extending in the second or first direction,
    wherein the plurality of memory cells each have a read transistor which has a gate controlled by the potential of one of the pair of storage nodes and which drives the read line.

7. The static random access memory according to claim 6, further comprising:
    a first decoder, which decodes one of the row address and the column address;
    a second decoder, which decodes the other of the row address and the column address;
    a read word line driving circuit, which drives any one of the plurality of read word lines, according to a plurality of first selection signals output by the first decoder; and
    a read line selection circuit, which selects any one of the plurality of read lines, according to a plurality of second selection signals output by the second decoder.

8. The static random access memory according to claim 7, wherein the read word line driving circuit performs driving in response to a read enable signal.

9. The static random access memory according to claim 7, further comprising a precharge circuit which precharges each of the plurality of read lines.

10. The static random access memory according to claim 7, further comprising a sense amplifier circuit which amplifies the potential of the read line selected by the read line selection circuit.

11. The static random access memory according to claim 1, wherein, in a write operation, one of the pair of write transistors within the selected memory cell is conducting, so that the write data is written to the latch circuit.

12. A static random access memory, comprising:
a plurality of memory cells, arranged in row and column directions;
a plurality of first write word lines, extending in a first direction among the row and column directions; and
a plurality of second write word line pairs, extending in a second direction among the row and column directions;
wherein the plurality of memory cells each have a latch circuit, in which input and output terminals of a pair of inverters are cross-connected and which maintains complementary levels at a pair of storage nodes, a pair of write transistors provided between the pair of storage nodes and a prescribed power supply voltage, and a pair of write selection transistors which are provided between the first write word line and the gates of the pair of write transistors, and the gates of which are controlled by the second write word line pair,
and wherein the gate potentials of the pair of write transistors are respectively controlled according to the potentials of the first write word line and of the second write word line pair.

13. The static random access memory according to claim 12, wherein the plurality of first write word lines are selected based on a first address among row and column addresses, and the plurality of second write word line pairs are selected based on the write data and a second address among the row and column addresses.

14. The static random access memory according to claim 12, further comprising a plurality of read word lines extending in the first or second direction, and a read line intersecting the read word lines and extending in the second or first direction, wherein the plurality of memory cells each have a read transistor, the gate of which is controlled by the potential of one of the pair of storage nodes, and which drives the read line.

15. The static random access memory according to claim 12, wherein, when the first direction is the row direction, a memory cell array in which the plurality of memory cells are arranged is longer in the row direction than in the column direction.

16. The static random access memory according to claim 12, wherein, when the first direction is the column direction, a memory cell array in which the plurality of memory cells are arranged is longer in the column direction than in the row direction.

* * * * *